(12) United States Patent
Wang

(10) Patent No.: US 11,070,048 B2
(45) Date of Patent: Jul. 20, 2021

(54) OVERCURRENT PROTECTION CIRCUIT, OVERCURRENT PROTECTION METHOD, AND DISPLAY DEVICE

(71) Applicants: HKC CORPORATION LIMITED, Guangdong (CN); CHONGQING HKC OPTOELECTRONICS TECHNOLOGY CO., LTD., Chongqing (CN)

(72) Inventor: Mingliang Wang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 347 days.

(21) Appl. No.: 16/313,783

(22) PCT Filed: Nov. 22, 2018

(86) PCT No.: PCT/CN2018/116819
§ 371 (c)(1),
(2) Date: Dec. 27, 2018

(87) PCT Pub. No.: WO2020/042389
PCT Pub. Date: Mar. 5, 2020

(65) Prior Publication Data
US 2020/0067300 A1 Feb. 27, 2020

(30) Foreign Application Priority Data
Aug. 27, 2018 (CN) .......................... 201810979199.5

(51) Int. Cl.
*H02H 3/093* (2006.01)
*G01R 17/02* (2006.01)
*G01R 19/165* (2006.01)

(52) U.S. Cl.
CPC ............. *H02H 3/093* (2013.01); *G01R 17/02* (2013.01); *G01R 19/16571* (2013.01)

(58) Field of Classification Search
CPC .. H02H 3/093; G01R 17/02; G01R 19/16571; G09G 3/2096; G09G 2330/12;
(Continued)

(56) References Cited

U.S. PATENT DOCUMENTS

| 2011/0063277 A1* | 3/2011 | Menke ................. G09G 3/3208 345/212 |
| 2014/0268458 A1* | 9/2014 | Luciani .................... H02H 3/10 361/86 |

* cited by examiner

*Primary Examiner* — Dharti H Patel

(57) ABSTRACT

An overcurrent protection circuit, an overcurrent protection method, and a display device are disclosed. The overcurrent protection circuit includes: a voltage generation circuit, a current detection circuit, and a microcontroller. An input end of the voltage generation circuit is connected to a power supply, an output end of the voltage generation circuit is connected to an input end of the current detection circuit, and a first output end of the current detection circuit is connected to a first input end of the microcontroller. The voltage generation circuit generates a low-order voltage, and transmits the low-order voltage to the current detection circuit. The current detection circuit generates a first current value based on the low-order voltage and transmits the first current value to the microcontroller. The microcontroller outputs a set overcurrent protection value based on a total current value of the overcurrent protection circuit and the first current value.

17 Claims, 3 Drawing Sheets

(58) Field of Classification Search
CPC ............. G09G 2310/0267; G09G 3/20; G09G 2330/04; G09G 2330/045; G09G 2320/029
USPC ........................................................ 361/93.1
See application file for complete search history.

| Current calculation comparison table (it is assumed that a total current value is 250 mA) ||
|---|---|
| Current generated by outputting a low-order voltage (mA) | Current flowing through a level shifter (mA) |
| 200 | 50 |
| 170 | 80 |
| ⋮ | ⋮ |
| 150 | 100 |
| 100 | 150 |

OVERCURRENT PROTECTION CIRCUIT, OVERCURRENT PROTECTION METHOD, AND DISPLAY DEVICE

CROSS-REFERENCES TO RELATED APPLICATION

This application is the International Application No. PCT/CN2018/116819 for entry into US national phase with an international filing date of Nov. 22, 2018 designating US, now pending, and claims priority to Chinese Patent Application No. 201810979199.5, filed with the Chinese Patent Office on Aug. 27, 2018 and entitled "OVERCURRENT PROTECTION CIRCUIT AND DISPLAY DEVICE", which is incorporated herein by reference in its entirety.

BACKGROUND

Technical Field

The present application relates to the field of overcurrent protection technologies, and in particular, to an overcurrent protection circuit, an overcurrent protection method, and a display device.

Related Art

The description herein provides only background information related to the present application, but does not necessarily constitute the prior art. A thin film transistor-liquid crystal display (ITT-LCD) is a most common display device currently. A drive circuit of the TFT-LCD includes a power integrated circuit (Power IC), a timing control integrated circuit (TCON IC), and a gate driver integrated circuit (Gate Driver IC). The power IC generates, based on data and a signal of a system, voltages required by other circuits for working. The timing control IC generates working timing of the gate driver IC based on the data and the signal of the system. The gate driver IC generates high-level and low-level digital voltages and outputs the digital voltages to a gate of a TFT switch to control a switch of each row of pixels.

Currently, as a bezel of a display device becomes narrower, a novel gate driver less (GDL) drive architecture is more widely applied. In a GDL circuit, an original gate driver is split into two parts: a level shifter integrated circuit and a shift register. The level shifter integrated circuit is disposed on a drive board, and the shift register is disposed on a panel. The level shifter integrated circuit transmits a clock signal CLK to the shift register to drive scanning lines row by row.

Working abnormality in the panel may be caused due to factors of wiring of the foregoing GDL architecture and a production process. For example, when a current flows from a TFT on-state high-order voltage VGH to a TFT low-order voltage VGL (that is, a positive input voltage is converted into a negative output voltage), an impedance between the high-order voltage VGH and the low-order voltage VGL is relatively low due to the abnormality in the panel, causing the current in the circuit to be excessively large. When the clock signal is switched between a high level and a low level, the current also abruptly changes, causing an increase of a current signal. An excessively large current may cause a liquid crystal board to be burned. Therefore, an overcurrent protection circuit is disposed on each of the level shifter integrated circuit and the power IC. When the low-order voltage VGL or a plurality of scanning clock signals is output, and after a protection current that is set for the power IC or the level shifter integrated circuit is exceeded, the corresponding power IC or level shifter integrated circuit turns off output. However, the abnormality in the panel is various, sometimes, currents generated by outputting a low-order voltage signal and the plurality of scanning clock signals are both relatively large but do not trigger respective set current protection, in this case, a probability of burning of the panel also exists. Consequently, the display panel may be burned because it cannot be detected that the current generated by outputting the low-order voltage and the current generated by outputting the plurality of scanning clock signals are both excessively large but do not trigger respective set current protection, causing a loss.

SUMMARY

An objective of the present application is to provide an overcurrent protection circuit, to resolve problems, including but not limited to, that a whole current is excessively large because it cannot be detected that a current generated by outputting a low-order voltage and a current generated by outputting a plurality of scanning clock signals are both relatively large but do not trigger respective set current protection, causing a display panel to be burned.

A technical solution used in an embodiment of the present application is: an overcurrent protection circuit provided in this embodiment of the present application, including: a voltage generation circuit, a current detection circuit, and a microcontroller, where an input end of the voltage generation circuit is configured to be connected to a power supply, an output end of the voltage generation circuit is configured to be connected to an input end of the current detection circuit, and a first output end of the current detection circuit is configured to be connected to a first input end of the microcontroller; and the voltage generation circuit is configured to be connected to the power supply, to generate a low-order voltage, and to transmit the low-order voltage to the current detection circuit; the current detection circuit is configured to generate a first current value based on the low-order voltage and transmits the first current value to the microcontroller; and the microcontroller is configured to output, based on a total current value of the overcurrent protection circuit and the first current value, a set overcurrent protection value corresponding to a scanning clock signal.

In an embodiment, the current detection circuit is configured to detect a current generated when the low-order voltage is output, to convert the current into the first current value in a digital form, and to transmit the first current value to the microcontroller.

In an embodiment, the microcontroller includes a calculator configured for calculating, based on the total current value and the first current value, the set overcurrent protection value corresponding to the scanning clock signal.

In an embodiment, the overcurrent protection circuit further includes a first serial bus connected to the current detection circuit and a second serial bus connected to the microcontroller, where the current detection circuit is configured to transmit the first current value to the microcontroller via the first serial bus; and the microcontroller is configured to output the set overcurrent protection value via the second serial bus.

In an embodiment, each of the first serial bus and the second serial bus is a bidirectional two-line synchronization serial bus comprising a bidirectional serial data line and a clock line.

In an embodiment, the overcurrent protection circuit further includes a level shifter, and the level shifter includes a voltage boosting circuit and an overcurrent setting circuit, where an output end of the voltage boosting circuit is connected to a first input end of the overcurrent setting circuit; and the voltage boosting circuit is configured to be input with a first clock signal, to generate the scanning clock signal based on the first clock signal, and to transmit a second current value corresponding to the scanning clock signal to the overcurrent setting circuit, and the overcurrent setting circuit is configured to control, based on the second current value, the level shifter to output the scanning clock signal.

In an embodiment, that the overcurrent setting circuit is configure to control, based on the second current value, the level shifter to output the scanning clock signal includes:

in the case that the second current value corresponding to the scanning clock signal exceeds the set overcurrent protection value, current protection is activated so that no corresponding scanning clock signal is output from the level shifter and drive for a present path is stopped; or in the case that the second current value corresponding to the scanning clock signal falls within a range of the set overcurrent protection value, the scanning clock signal is continuously output from the level shifter, a corresponding high-order or low-order voltage is controlled to be output, and the present path is driven to be charged or discharged.

In an embodiment, an output end of the microcontroller is connected to a second input end of the overcurrent setting circuit; and the microcontroller is configured to transmit the set overcurrent protection value to the overcurrent setting circuit via the second serial bus.

In an embodiment, the set overcurrent protection value is equal to a difference between the total current value and the first current value.

In an embodiment, the second input end of the overcurrent setting circuit is connected to the output end of the microcontroller via the first serial bus to receive the set overcurrent protection value that is output by the microcontroller; and the overcurrent setting circuit is configured to control, based on the set overcurrent protection value and the second current value, the level shifter to output the scanning clock signal; and in the case that the second current value is less than the set overcurrent protection value, the level shifter is controlled to output the scanning clock signal; or in the case that the second current value is greater than or equal to the set overcurrent protection value, the level shifter is controlled to turn off output.

In an embodiment, a second input end of the microcontroller is configured to receive the total current value of the overcurrent protection circuit, wherein the total current value is a total sum of a current value generated by outputting the low-order voltage and the set overcurrent protection value.

In an embodiment, a second output end of the current detection circuit is configured to output the low-order voltage to a scanning line of a display panel.

In an embodiment, the overcurrent protection circuit is disposed in a power circuit of the display device.

Another objective of the present application is to provide an overcurrent protection method, including:

obtaining, by a current detection circuit, a low-order voltage as generated by a voltage generation circuit;

obtaining, by the current detection circuit and based on the low-order voltage, a first current value corresponding to the low-order voltage; and calculating, by a microcontroller based on a total current value of an overcurrent protection circuit and the first current value, a set overcurrent protection value corresponding to a scanning clock signal.

Still another objective of the present application is to provide a display device, including a display panel and an overcurrent protection circuit, where the overcurrent protection circuit includes a voltage generation circuit, a current detection circuit, and a microcontroller, where an input end of the voltage generation circuit is configured to be connected to a power supply, an output end of the voltage generation circuit is configured to be connected to an input end of the current detection circuit, and a first output end of the current detection circuit is configured to be connected to a first input end of the microcontroller; and the voltage generation circuit is configured to connected to the power supply, to generate a low-order voltage, and to transmit the low-order voltage to the current detection circuit; the current detection circuit is configured to generate a first current value based on the low-order voltage and transmits the first current value to the microcontroller and the microcontroller is configured to output, based on a total current value of the overcurrent protection circuit and the first current value, a set overcurrent protection value corresponding to a scanning clock signal.

In an embodiment, the overcurrent protection circuit is disposed in a power circuit of the display device.

In an embodiment, the current detection circuit is configured to detect a current generated when the low-order voltage is output, to convert the current into the first current value in a digital form, and to transmit the first current value to the microcontroller.

In an embodiment, the microcontroller includes a calculator for calculating, based on the total current value and the first current value, the set overcurrent protection value corresponding to the scanning clock signal.

In an embodiment, the overcurrent protection circuit further includes a level shifter, and the level shifter includes a voltage boosting circuit and an overcurrent setting circuit, where an output end of the voltage boosting circuit is connected to a first input end of the overcurrent setting circuit; and the voltage boosting circuit is configured to be input with a first clock signal, to generate the scanning clock signal based on the first clock signal, and to transmit a second current value corresponding to the scanning clock signal to the overcurrent setting circuit, and the overcurrent setting circuit is configured to control, based on the second current value, the level shifter to output the scanning clock signal.

In an embodiment, that the overcurrent setting circuit is configured to control, based on the second current value, the level shifter to output the scanning clock signal includes:

in the case that the second current value corresponding to the scanning clock signal exceeds the set overcurrent protection value, current protection is activated so that no corresponding scanning clock signal is output form the level shifter and drive of a present path is stopped; or in the case that the second current value corresponding to the scanning clock signal falls within a range of the set overcurrent protection value, the scanning clock signal is contiguously output from the level shifter, a corresponding high-order or low-order voltage is output under control, and the present path is driven to be charged or discharged.

According to the overcurrent protection circuit, the overcurrent protection method, and the display device that are provided in the embodiments of the present application, the current value generated when the low-order voltage is output is detected, to determine the set overcurrent protection value corresponding to the scanning clock signal. When the current value corresponding to the low-order voltage continuously changes, the set overcurrent protection value corresponding to the scanning clock signal can be more precisely controlled, to protect the display panel and prevent the display panel from being burned.

BRIEF DESCRIPTION OF THE DRAWINGS

To describe the technical solutions in embodiments of the present application more clearly, the accompanying drawings for illustrating the embodiments or the exemplary technology are given briefly below. Apparently, the accompanying drawings are only for the exemplary purpose, and persons of ordinary skill in the art can derive other drawings from the accompanying drawings without creative efforts.

DETAILED DESCRIPTION

To make objectives, technical solutions and advantages of the present application more understandable and comprehensible, the present application is further described in detail below with reference to accompanying drawings and embodiments. It should be understood that the embodiments herein are provided for describing the present application and not intended to limit the present application.

It should be noted that when an element is referred to as being "fixed" to or "disposed" on another element, it can be directly fixed to or disposed on the other element or intervening elements may also be present. When an element is referred to as being "coupled" or "connected" to another element, it can be directly or indirectly coupled or connected to the other element. Orientation or position relationships indicated by the terms such as "on", "below", "left", and "right" are based on orientation or position relationships shown in the accompanying drawings, and are used only for ease of illustration description, rather than indicating or implying that the mentioned apparatus or component must have a particular orientation or must be constructed and operated in a particular orientation. Therefore, such terms should not be construed as limiting of the present application. Persons of ordinary skill in the art can understand the specific meaning of these terms according to specific situations. The terms such as "first" and "second" are used only for the purpose of description, and should not be understood as indicating or implying the relative importance or implicitly specifying the number of the indicated technical features. Unless otherwise particularly defined, "a plurality of" means two or more than two.

The technical solutions of the present application will be described in detail below with reference to the accompanying drawings and embodiments.

Figure 1:
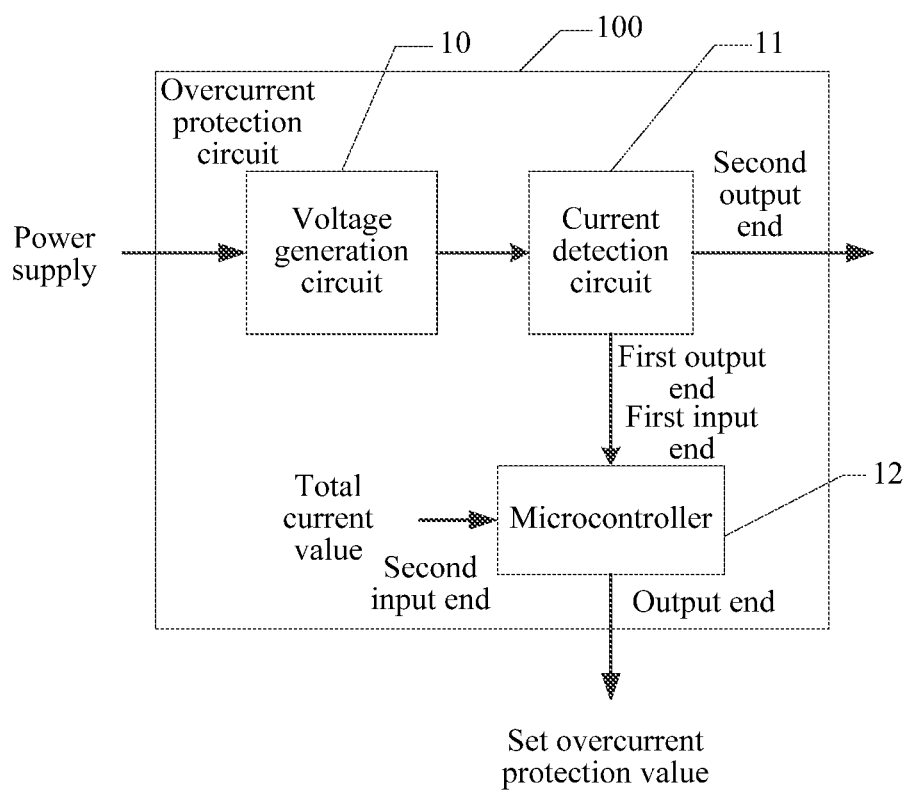
FIG. 1 is a schematic diagram of an overcurrent protection circuit according to an embodiment of the present application.

FIG. 1 is a schematic diagram of an overcurrent protection circuit according to an embodiment of the present application. For ease of description, only parts related to this embodiment of the present application are shown.

The overcurrent protection circuit shown in the figure may be applied to a display device, and the overcurrent protection circuit is disposed in a power circuit (for example, a power IC) of the display device. The power circuit may generate five working voltages by using a system interface input voltage, and the five working voltages include a maximum on-state voltage VGH on a scanning line that is used for switching on a TFT and a low-order voltage VGL on the scanning line that is used for controlling state switching of the TFT. A value of the low-order voltage VGL may be −5V, and minimally may reach −40V.

The overcurrent protection circuit 100 includes a voltage generation circuit 10, a current detection circuit 11, and a microcontroller 12.

An input end of the voltage generation circuit 10 is connected to a power supply, an output end of the voltage generation circuit 10 is connected to an input end of the current detection circuit 11, and a first output end of the current detection circuit 11 is connected to a first input end of the microcontroller 12.

The voltage generation circuit 10 is connected to the power supply, generates the low-order voltage, and transmits the low-order voltage to the current detection circuit 11. The current detection circuit 11 generates a first current value based on the low-order voltage and transmits the first current value to the microcontroller 12. The current detection circuit detects a current generated when the low-order voltage is output, converts the current into the first current value in a digital form, and transmits the first current value to the microcontroller. The microcontroller 12 outputs, based on a total current value of the overcurrent protection circuit and the first current value, a set overcurrent protection value corresponding to a scanning clock signal. The microcontroller 12 includes a calculator for calculating, based on the total current value and the first current value, the set overcurrent protection value corresponding to the scanning clock signal.

The first current value is a current value generated when the low-order voltage VOL is output. In this embodiment, the set overcurrent protection value corresponding to the low-order voltage VGL is not set, but only the current generated when the low-order voltage VGL is output is detected. The total current value is a total current value of a power drive circuit that is detected by the present protection circuit, and includes the current value generated when the low-order voltage is output and a current value generated when a clock signal is output or a clock signal jumps. The total current value may be a fixed value within a time period, or may be a total current value varying as working status of the circuit changes. The scanning clock signal is a clock signal that is output to a shift register and that may directly drive a corresponding scanning line path to charge or discharge. For example, if a display panel is a liquid crystal display panel, a scanning clock signal that can be used for switching on or switching off a TFT of a liquid crystal display is output. When the scanning clock signal is changed from a low level to a high level, a forward current abrupt-change is generated in the circuit, so that the current in the circuit increases. In addition, a scanning line of each path corresponds to one low-order voltage signal and a plurality of clock signals, and a current corresponding to each clock signal is much smaller than the current generated by outputting the low-order voltage. Therefore, the current generated by outputting the low-order voltage is detected to control current values of the plurality of clock signals on each path, so that overcurrent protection of the power drive circuit can be more precisely and simply activated, to achieve an objective of protecting the display panel.

In a specific application, the display panel includes a pixel array including a plurality of rows of subpixels and a plurality of columns of subpixels. The rows of subpixels are connected to a source driver module, and the columns of subpixels are connected to a gate driver module. The number of rows and the number of columns of the pixel array may be set based on a specific requirement. The source driver module may be any component or circuit, for example, a source driver integrated circuit (source driver IC) or a thin film source-chip on film (S-COF), which has a function of performing data driving on pixels of the display panel. The gate driver module may be any component or circuit, for example, a gate driver integrated circuit (gate driver IC) or a thin film gate-chip on film (G-COF), that has a function of scanning and charging the pixels of the display panel.

A person skilled in the art may clearly learn that for ease and brevity of description, division of the foregoing functional circuits is only used as an example for description. During actual application, the foregoing functions may be allocated, as required, to different functional components for completion, to complete all or some of the foregoing functions.

Figures 2, 3:
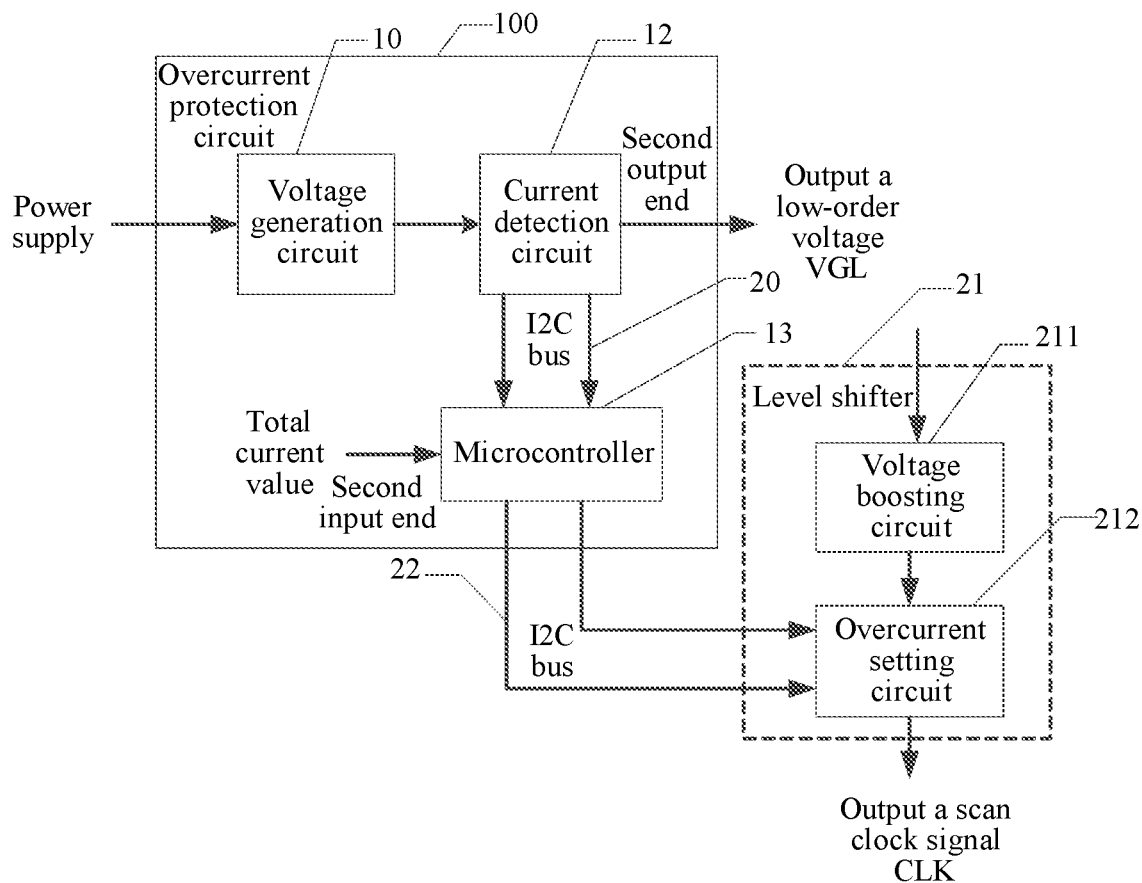
FIG. 2 is a schematic diagram of overall implementation of an overcurrent protection circuit according to an embodiment of the present application.
FIG. 3 is a schematic diagram of current calculation comparison according to an embodiment of the present application.

FIG. 2 is a schematic diagram of overall implementation of an overcurrent protection circuit according to an embodiment of the present application. For ease of description, only parts related to this embodiment of the present application are shown.

The overcurrent protection circuit 100 shown in the figure includes a voltage generation circuit 10, a current detection circuit 11, and a microcontroller 12, and further includes a first serial bus 20 connected to the current detection circuit 11 and a second serial bus 22 connected to the microcontroller 12. The current detection circuit 11 transmits a first current value to the microcontroller 12 via the first serial bus 20; and the microcontroller 12 outputs, via the second serial bus 22, a set overcurrent protection value corresponding to a scan signal. The microcontroller determines, based on an obtained total current value and the first current value, the set overcurrent protection value corresponding to the scanning clock signal that needs to be output.

In an embodiment, the overcurrent protection circuit further includes a level shifter 21, and the level shifter includes a voltage boosting circuit 211 and an overcurrent setting circuit 212. An output end of the voltage boosting circuit 211 is connected to a first input end of the overcurrent setting circuit 212. A first clock signal is input into the voltage boosting circuit 211, and the voltage boosting circuit 211 generates the scanning clock signal based on the first clock signal, and transmits a second current value corresponding to the scanning clock signal to the overcurrent setting circuit 212. The overcurrent setting circuit 212 controls, based on the second current value, the level shifter to output the scanning clock signal. If the second current value corresponding to the scanning clock signal exceeds the set overcurrent protection value, current protection is activated, and the level shifter skips outputting the corresponding scanning clock signal and stops drive of a present path. If the second current value corresponding to the scanning clock signal falls within a range of the set overcurrent protection value, the level shifter continues outputting the scanning clock signal, controls output of a corresponding high-order or low-order voltage, and drive the present path to charge or discharge.

The scanning clock signal may be a vertical clock signal, and a time of outputting a logic signal by a shift register is controlled by the vertical clock signal. The output logic signal is used for generating a high-order voltage VGH and a low-order voltage VGL of a corresponding path.

In addition, the level shifter is configured to convert a logical level VDD/VSS of a low voltage into a voltage VGH/VGL having high amplitude. This is implemented through a voltage boosting action of the level shifter. The level shifter is a key part of a gate driver IC. In the level shifter, a logical level signal of the low voltage is first decreased to the low-order voltage VGL of the entire integrated circuit, and then is increased to the high-order voltage VGH. The level shifter outputs a digital signal, for example, a clock signal, that corresponds to the high-order voltage and the low-order voltage.

In an embodiment, an output end of the microcontroller 12 is connected to a second input end of the overcurrent setting circuit 212. The microcontroller 12 transmits the set overcurrent protection value to the overcurrent setting circuit 212 via the second serial bus 22. A set overcurrent value of the overcurrent setting circuit 212 is changed by using the set overcurrent protection value transmitted by the microcontroller 12 in real time, to implement linkage between a current of VGL and a current of the scanning clock signal. When the current of VGL is excessively large, the set overcurrent value of the level shifter correspondingly decreases, and the level shifter can activate overcurrent protection more easily, so that output can be turned off, to achieve an objective of protecting a display panel.

In an embodiment, each of the serial buses 20, 22 is a bidirectional two-line synchronization serial bus I2C including a bidirectional serial data line and a clock line. The serial buses may alternatively be other universal serial buses.

In an embodiment, the set overcurrent protection value is equal to a difference between the total current value and the first current value. In a current calculation comparison table shown in FIG. 3 that is provided in this embodiment of the present application, if the total current value Δ within a time period is 250 mA, when the current generated based on the voltage VGL is 200 mA, the set overcurrent protection value of the level shifter is set to 50 mA. When the current generated based on the voltage. VGL is 170 mA, the set overcurrent protection value of the level shifter is set to 80 mA. A value change of the current controlled by the overcurrent protection circuit in this embodiment of the present application is continuous. When the total current value is fixed, the current of VGL continuously changes, and the set overcurrent value of the level shifter also continuously changes, to implement more precise overcurrent protection.

In an embodiment, the second input end of the overcurrent setting circuit 212 is connected to the output end of the microcontroller 12 via the second serial bus I2C and receives the set overcurrent protection value that is output by the microcontroller. The overcurrent setting circuit 212 controls, based on the set overcurrent protection value and the second current value, the level shifter to output the scanning clock signal.

If the second current value is less than the set overcurrent protection value, the level shifter is controlled to output the scanning clock signal.

If the second current value is greater than or equal to the set overcurrent protection value, the level shifter is controlled to rum off the output. When the level shifter turns off the output, the digital signal corresponding to the low-order voltage VGL is not output, and the low-order voltage is not output from a drive circuit of the display panel. Therefore, state switching of a TFT is not driven.

When abnormality exists in the display panel, an impedance between a positive input pin of a liquid crystal display screen and a negative input pin of the liquid crystal display screen may be relatively low, resulting in an excessively large current generated when the voltage is output. When the current generated by outputting the voltage varies from 170 mA to 200 mA, the set overcurrent value of the level shifter correspondingly decreases from 80 mA to 50 mA. If the current generated based on the clock signal of the level shifter exceeds a current set overcurrent value, overcurrent protection is activated to turn off outputting of the clock signal and stop driving the display panel, to protect the display panel and prevent the display panel from being burned.

In an embodiment, a second input end of the microcontroller receives the total current value of the overcurrent protection circuit, where the total current value is a total sum of a current value generated by outputting the low-order voltage and the set overcurrent protection value.

In an embodiment, if the second current value is less than the set overcurrent protection value, the level shifter is controlled to output the scanning clock signal. In addition, a second output end of the current detection circuit outputs the low-order voltage VGL to a scanning line of the display panel, to drive the state switching of the TFT.

It should be noted that the total current value is a total sum of the current generated by outputting the low-order voltage VGL and the set overcurrent protection value.

In an embodiment, the present application provides an overcurrent protection method implemented based on the overcurrent protection circuit shown in FIG. 1 or FIG. 2. The overcurrent protection method may be a software program in a display device, and the overcurrent protection method includes:

obtaining, by a current detection circuit, a low-order voltage generated by a voltage generation circuit;

obtaining, by the current detection circuit based on the low-order voltage, a first current value corresponding to the low-order voltage; and calculating, by a microcontroller based on a total current value of an overcurrent protection circuit and the first current value, a set overcurrent protection value corresponding to a scanning clock signal.

Figure 4:
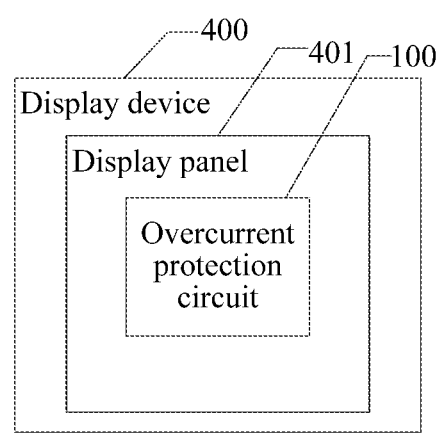
FIG. 4 is a schematic diagram of a display device according to an embodiment of the present application.

FIG. 4 is a schematic diagram of a display device according to an embodiment of the present application. The display device 400 includes a display panel 401 and the foregoing overcurrent protection circuit 100.

In an embodiment, the display panel 401 may be any type of display panel, for example, a liquid crystal display panel based on an LCD technology, an organic light-emitting diode (OLED) display panel based on an OLED technology, a quantum dot light emitting diode (QLED) display panel based on a QLED technology, or a curved display panel.

The above descriptions are merely optional embodiments of the present application, and are not intended to limit the present application. It should be understood by persons skilled in the art that various modifications and variations can be made to the present application. Any modification, equivalent replacement, or improvement made without departing from the spirit and principle of the present application shall fall within the scope as defined by the appended claims.

What is claimed is:

1. An overcurrent protection circuit for a display device, wherein the overcurrent protection circuit comprises a voltage generation circuit, a current detection circuit, and a microcontroller, wherein an input end of the voltage generation circuit is connected to a power supply, an output end of the voltage generation circuit is connected to an input end of the current detection circuit, and a first output end of the current detection circuit is connected to a first input end of the microcontroller; and the voltage generation circuit is connected to the power supply, generates a low-order voltage, and transmits the low-order voltage to the current detection circuit; the current detection circuit generates a first current value based on the low-order voltage and transmits the first current value to the microcontroller; and the microcontroller outputs, based on a total current value of the overcurrent protection circuit and the first current value, a set overcurrent protection value corresponding to a scanning clock signal, the overcurrent protection circuit further comprising a serial bus connected to the current detection circuit and the microcontroller, the current detection circuit transmits the first current value to the microcontroller via the serial bus; and the microcontroller outputs the set overcurrent protection value via the serial bus.

2. The overcurrent protection circuit according to claim 1, wherein the current detection circuit detects a current generated when the low-order voltage is output, converts the current into the first current value in a digital form, stores the first current value, and transmits the first current value to the microcontroller.

3. The overcurrent protection circuit according to claim 1, wherein the microcontroller comprises a calculator configured for calculating, based on the total current value and the first current value, the set overcurrent protection value corresponding to the scanning clock signal.

4. The overcurrent protection circuit according to claim 1, wherein the serial bus is a bidirectional two-line synchronization serial bus comprising a bidirectional serial data line and clock line.

5. The overcurrent protection circuit according to claim 1, wherein the overcurrent protection circuit further comprises a level shifter, and the level shifter comprises a voltage boosting circuit and an overcurrent setting circuit, wherein an output end of the voltage boosting circuit is connected to a first input end of the overcurrent setting circuit; and the voltage boosting circuit is input with a first clock signal, generates the scanning clock signal based on the first clock signal, and transmits a second current value corresponding to the scanning clock signal to the overcurrent setting circuit, and the overcurrent setting circuit controls, based on the second current value, the level shifter to output the scanning clock signal.

6. The overcurrent protection circuit according to claim 5, wherein that the overcurrent setting circuit controls, based on the second current value, the level shifter to output the scanning clock signal comprises:

in the case that the second current value corresponding to the scanning clock signal exceeds the set overcurrent protection value, current protection is activated so that no corresponding scanning clock signal is output from the level shifter and drive for a present path is stopped; or in the case that the second current value corresponding to the scanning clock signal falls within a range of the set overcurrent protection value, the scanning clock signal is continuously output from the level shifter, a corresponding high-order or low-order voltage is controlled to be output, and the present path is driven to be charged or discharged.

7. The overcurrent protection circuit according to claim 5, wherein an output end of the microcontroller is connected to a second input end of the overcurrent setting circuit; and
the microcontroller transmits the set overcurrent protection value to the overcurrent setting circuit via the serial bus.

8. The overcurrent protection circuit according to claim 7, wherein the set overcurrent protection value is equal to a difference between the total current value and the first current value.

9. The overcurrent protection circuit according to claim 7, wherein the second input end of the overcurrent setting circuit is connected to the output end of the microcontroller via the serial bus to receive the set overcurrent protection value that is output by the microcontroller; and the overcurrent setting circuit controls, based on the set overcurrent protection value and the second current value, the level shifter to output the scanning clock signal; and
in the case that the second current value is less than the set overcurrent protection value, the level shifter is controlled to output the scanning clock signal; or
in the case that the second current value is greater than or equal to the set overcurrent protection value, the level shifter is controlled to turn off output.

10. The overcurrent protection circuit according to claim 1, wherein a second input end of the microcontroller receives the total current value of the overcurrent protection circuit, wherein the total current value is a total sum of a current value generated by outputting the low-order voltage and the set overcurrent protection value.

11. The overcurrent protection circuit according to claim 1, wherein a second output end of the current detection circuit outputs the low-order voltage to a scanning line of a display panel.

12. The overcurrent protection circuit according to claim 1, wherein the overcurrent protection circuit is disposed in a power circuit of the display device.

13. A display device, comprising, a display panel and an overcurrent protection circuit, wherein the overcurrent protection circuit comprises a voltage generation circuit, a current detection circuit, and a microcontroller, wherein
an input end of the voltage generation circuit is connected to a power supply, an output end of the voltage generation circuit is connected to an input end of the current detection circuit, and a first output end of the current detection circuit is connected to a first input end of the microcontroller; and the voltage generation circuit is connected to the power supply, generates a low-order voltage, and transmits the low-order voltage to the current detection circuit; the current detection circuit generates a first current value based on the low-order voltage and transmits the first current value to the microcontroller; and the microcontroller outputs, based on a total current value of the overcurrent protection circuit and the first current value, a set overcurrent protection value corresponding to a scanning clock signal,
wherein the overcurrent protection circuit further comprises a level shifter, and the level shifter comprises a voltage boosting circuit and an overcurrent setting circuit, wherein
an output end of the voltage boosting circuit is connected to a first input end of the overcurrent setting circuit; and
the voltage boosting circuit is input with a first clock signal, generates the scanning clock signal based on the first clock signal, and transmits a second current value corresponding to the scanning clock signal to the overcurrent setting circuit, and the overcurrent setting circuit controls, based on the second current value, the level shifter to output the scanning clock signal.

14. The display device according to claim 13, wherein the overcurrent protection circuit is disposed in a power circuit of the display device.

15. The display device according to claim 13, wherein the current detection circuit detects a current generated when the low-order voltage is output, converts the current into the first current value in a digital form, stores the first current value, and transmits the first current value to the microcontroller.

16. The display device according to claim 13, wherein the microcontroller comprises a calculator for calculating, based on the total current value and the first current value, the set overcurrent protection value corresponding to the scanning clock signal.

17. The display device according to claim 13, wherein that the overcurrent setting circuit controls, based on the second current value, the level shifter to output the scanning clock signal comprises:
in the case that the second current value corresponding to the scanning clock signal exceeds the set overcurrent protection value, current protection is activated so that no corresponding scanning clock signal is output form the level shifter and drive of a present path is stopped; or
in the case that the second current value corresponding to the scanning clock signal falls within a range of the set overcurrent protection value, the scanning clock signal is contiguously output from the level shifter, a corresponding high-order or low-order voltage is output under control, and the present path is driven to be charged or discharged.

* * * * *